United States Patent [19]
Kimura

[11] Patent Number: 5,856,687
[45] Date of Patent: Jan. 5, 1999

[54] SEMICONDUCTOR DEVICE WITH CONNECTED SOURCE ELECTRODE PADS AT DIAGONAL CORNERS

[75] Inventor: Tomoaki Kimura, Tokyo, Japan

[73] Assignee: NEC Corporation, Tokyo, Japan

[21] Appl. No.: 889,052

[22] Filed: Jul. 7, 1997

[30] Foreign Application Priority Data

Jul. 4, 1996 [JP] Japan ................................. 8-174752

[51] Int. Cl.⁶ ................................................ H01L 29/80
[52] U.S. Cl. ........................ 257/235; 257/275; 257/786
[58] Field of Search ................................ 257/275, 786, 257/235

[56] References Cited

U.S. PATENT DOCUMENTS 5,109,270  4/1992  Nambu et al. ........................ 257/786
5,554,881  9/1996  Koyasu et al. ........................ 257/786

FOREIGN PATENT DOCUMENTS 5211179  8/1993  Japan .

*Primary Examiner*—Peter Toby Brown
*Assistant Examiner*—Roy Potter
*Attorney, Agent, or Firm*—Sughrue, Mion, Zinn, Macpeak & Seas, PLLC

[57] ABSTRACT

A semiconductor device includes a square pellet, a gate electrode pad, a drain electrode pad, a pair of source electrode pads, and a source electrode path. The pellet has first and second diagonal lines. The gate electrode pad is arranged on one of two corners located on the first diagonal line on the pellet. The drain electrode pad is arranged on the other of the two corners located on the first diagonal line on the pellet. The pair of source electrode pads are arranged on two corners located on the second diagonal line on the pellet. The source electrode path connects the source electrode pads to each other.

9 Claims, 5 Drawing Sheets

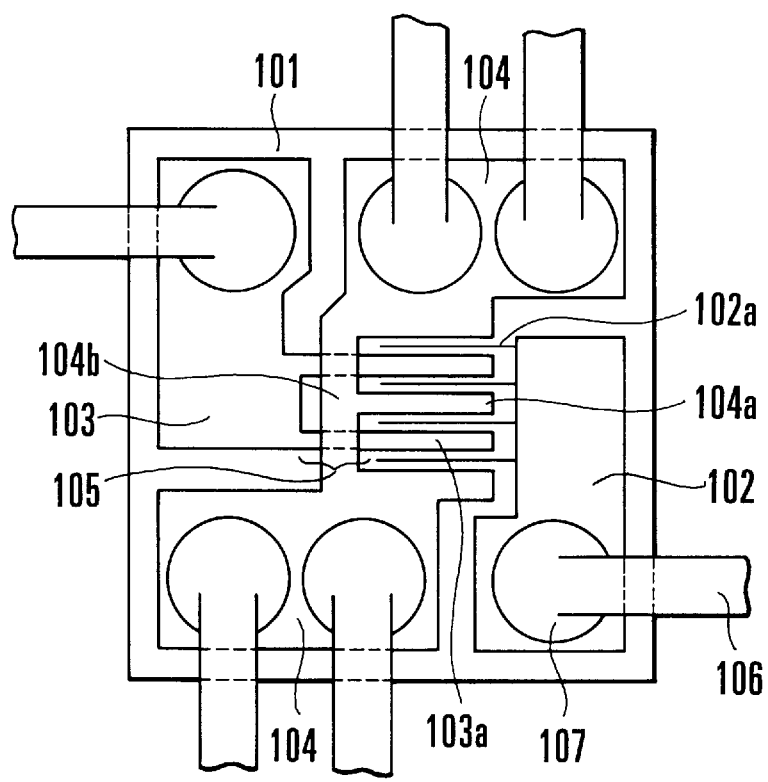
F I G. 3

SEMICONDUCTOR DEVICE WITH CONNECTED SOURCE ELECTRODE PADS AT DIAGONAL CORNERS

BACKGROUND OF THE INVENTION

The present invention relates to a semiconductor device and, more particularly, to a microwave transistor.

A low-noise transistor having a pattern as shown in FIG. 4 is conventionally widely used as a low-noise amplifying element for microwaves in the C to Ku bands. This pattern has a gate finger 12a, gate electrode pads 12, a source electrode pad 14, and a drain electrode pad 13. The gate finger 12a is straightly arranged on a pellet 11. The gate electrode pads 12 are led out from portions midway along the gate finger 12a to one side. The source electrode pad 14 surrounds the gate electrode pads 12. The drain electrode pad 13 is arranged on the other side of the source electrode pad 14 through the gate finger 12a. This pattern is called the $\pi$ type pattern. Bonding wires 16 are connected to the respective electrode pads 12, 13, and 14 through bonding balls 17.

In contrast to the $\pi$ type pattern, a low-noise transistor which forms a pattern by using aerial wirings has been developed in recent years. As shown in FIG. 5, this pattern has, e.g., a gate electrode pad 22, four gate fingers 22a, an H-shaped source electrode pad 24 and a source electrode path 24b, a source finger 24a, a drain electrode pad 23, two drain fingers 23a, and aerial wirings 25. The gate electrode pad 22 is arranged on a pellet 21. The four gate fingers 22a are led out from the gate electrode pad 22 to be parallel to each other. The source electrode pad 24 and the source electrode path 24b are arranged to sandwich the gate electrode pad 22 and the gate fingers 22a. The source finger 24a is led out from the source electrode path 24b and is arranged in a region sandwiched between the two central gate fingers 22a. The drain electrode pad 23 is arranged on the other side of the gate electrode pad 22 through the source electrode path 24b. The two drain fingers 23a are arranged in the two remaining regions sandwiched between the gate fingers 22a. The aerial wirings 25 connect the drain fingers 23a to lie across the source electrode path 24b. This pattern is called the H type pattern. Bonding wires 26 are connected to the respective electrode pads 22, 23, and 24 through bonding balls 27.

In the $\pi$ type pattern shown in FIG. 4, the gate electrode pads 12 are surrounded by the source electrode pad 14. In the H type pattern shown in FIG. 5, both the gate electrode pad 22 and the drain electrode pad 23 are sandwiched by the source electrode pad 24. Therefore, the area of the gate electrode pads or gate electrode pad 22 and the area of the drain electrode pad 23 are limited by the source electrode pads 14 and 24. More specifically, within the pellets 11 and 21 having a limited size, it is impossible to form the gate electrode pads 12 and 22 and the drain electrode pad 23 to have a large size, and a defect tends to be caused by misalignment in bonding.

SUMMARY OF THE INVENTION

It is an object of the present invention to provide a semiconductor device in which a defect caused by misalignment in bonding is prevented.

In order to achieve the above object, according to the present invention, there is provided a semiconductor device comprising a square pellet having first and second diagonal lines, a gate electrode pad arranged on one of two corners located on the first diagonal line on the pellet, a drain electrode pad arranged on the other of the two corners located on the first diagonal line on the pellet, a pair of source electrode pads arranged on two corners located on the second diagonal line on the pellet, and a source electrode path for connecting the source electrode pads to each other.

BRIEF DESCRIPTION OF THE DRAWINGS

FIG. 3 is a view showing the element pattern of a low-noise microwave transistor semiconductor device according to the third embodiment of the present invention;

DESCRIPTION OF THE PREFERRED EMBODIMENTS

The present invention will be described in detail below with reference to the accompanying drawings.

(First Embodiment)

Figure 1:
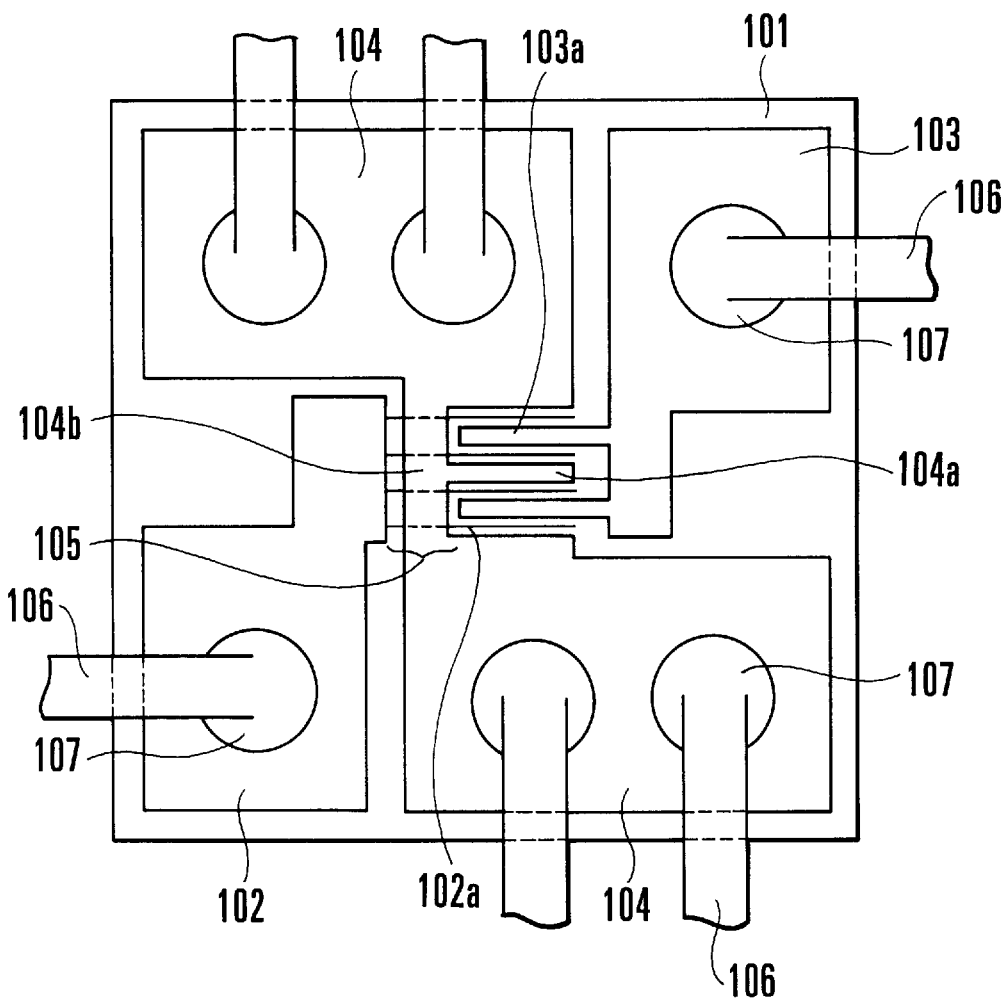
FIG. 1 is a view showing the element pattern of a low-noise microwave transistor semiconductor device according to the first embodiment of the present invention.

FIG. 1 shows the element pattern of a low-noise microwave transistor according to the first embodiment of the present invention. Referring to FIG. 1, the element pattern of this embodiment has a gate electrode pad 102, a drain electrode pad 103, and two source electrode pads 104. The gate electrode pad 102 is arranged on one of four corners on a square pellet 101 to be located on one diagonal line. The drain electrode pad 103 is arranged on the other of the corners located on this diagonal line. The source electrode pads 104 are arranged on the two corners located on the remaining diagonal line on the pellet 101.

Four comb-like gate fingers 102a are led out from the gate electrode pad 102 to the central portion of the pellet 101. Two drain fingers 103a led out from the drain electrode pad 103 are arranged on the two regions sandwiched by the two end portion-side gate fingers 102a.

The two source electrode pads 104 are connected to each other through a source electrode path 104b arranged between the gate electrode pad 102 and the distal ends of the drain fingers 103a led out from the drain electrode pad 103. The source electrode path 104b extends above the gate fingers 102a to lie across them through aerial wirings 105. A source finger 104a led out from the source electrode path 104b is arranged in a region sandwiched by the two central gate fingers 102a.

Bonding wires 106 are respectively bonded to the gate electrode pad 102 and the drain electrode pad 103 through bonding balls 107. Two bonding wires 106 are bonded to each of the two source electrode pads 104 through bonding balls 107, resulting in a total of four bonding wires 106. Many bonding wires 106 are bonded to the source electrode pads 104 in this manner in order to decrease the source ground impedance so as to cope with a high frequency.

According to the pattern arrangement described above, since the electrode pads, i.e., the bonding pads 102, 103, and 104 are arranged on the four corners of the pellet 101, the areas of the respective bonding pads 102, 103, and 104 can be maintained as large as possible on the pellet 101 having a limited size. For example, when the pellet 101 has an area of 350 μm², the total area of the bonding pads 102, 103, and 104 can be 100 μm².

If the areas of the bonding pads 102, 103, and 104 can be increased, the allowable range of misalignment in bonding is enlarged, and the defective bonding rate can be decreased. For example, the defective bonding rate can be decreased from 0.5% down to 0.01% or less.

As the bonding index speed increases, misalignment in bonding increases. According to the present invention, since the allowable range of misalignment in bonding is enlarged, the bonding index speed can be increased than in the conventional case. Therefore, the productivity can be improved by about 10%.

In this embodiment, the source electrode path 104b is formed by the aerial wirings. However, the gate fingers 102a may be formed by the aerial wirings. In place of the aerial wirings 105, cross wirings may be used in which upper wirings are formed over lower wirings through an insulating film.

(Second Embodiment)

Figure 2:
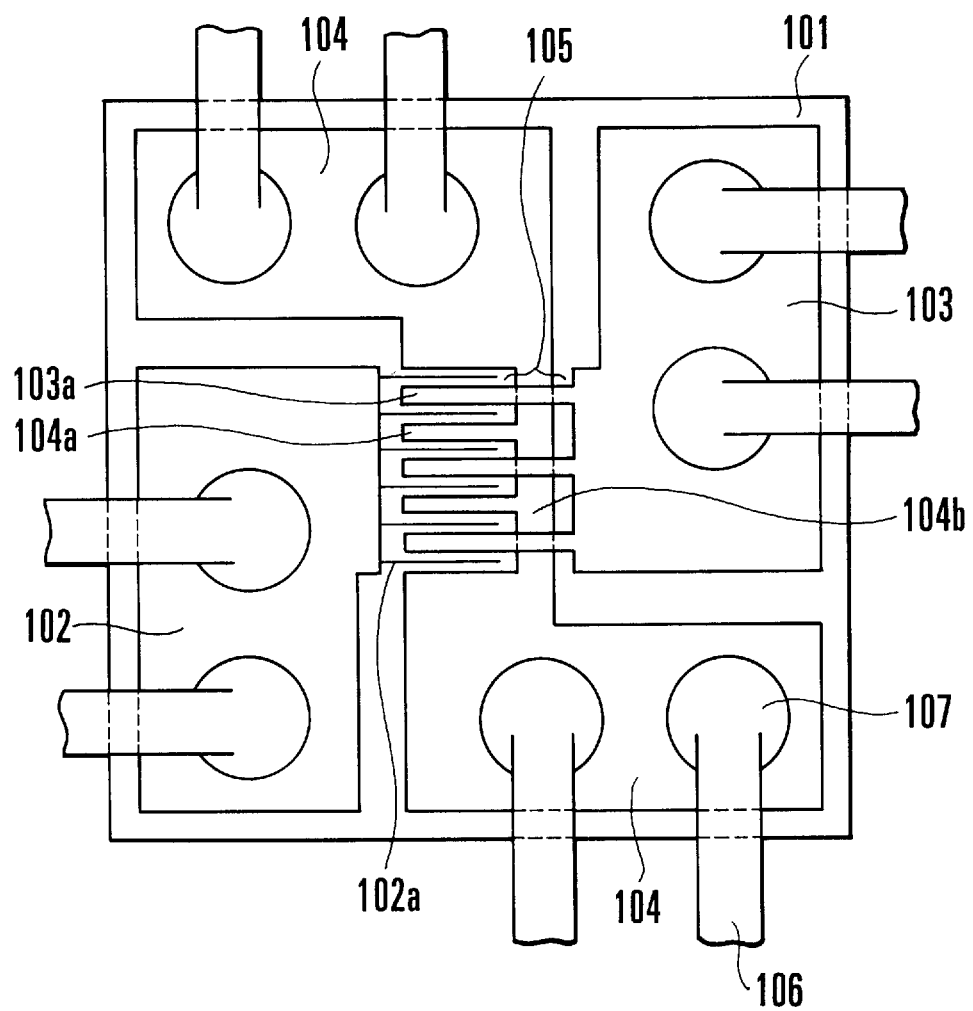
FIG. 2 is a view showing the element pattern of a low-noise microwave transistor semiconductor device according to the second embodiment of the present invention.
Figure 4:
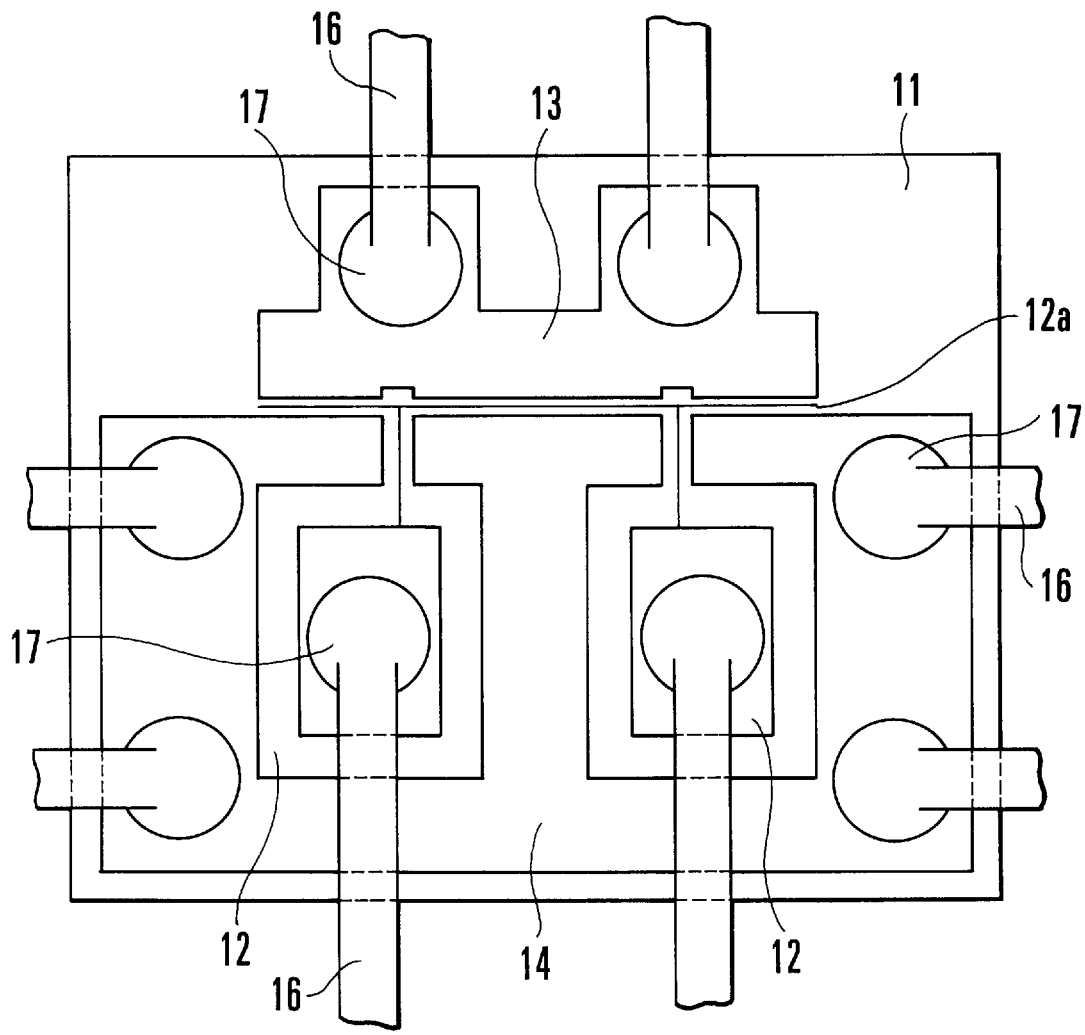
FIG. 4 is a view showing the $\pi$ type element pattern of a conventional semiconductor device.
Figure 5:
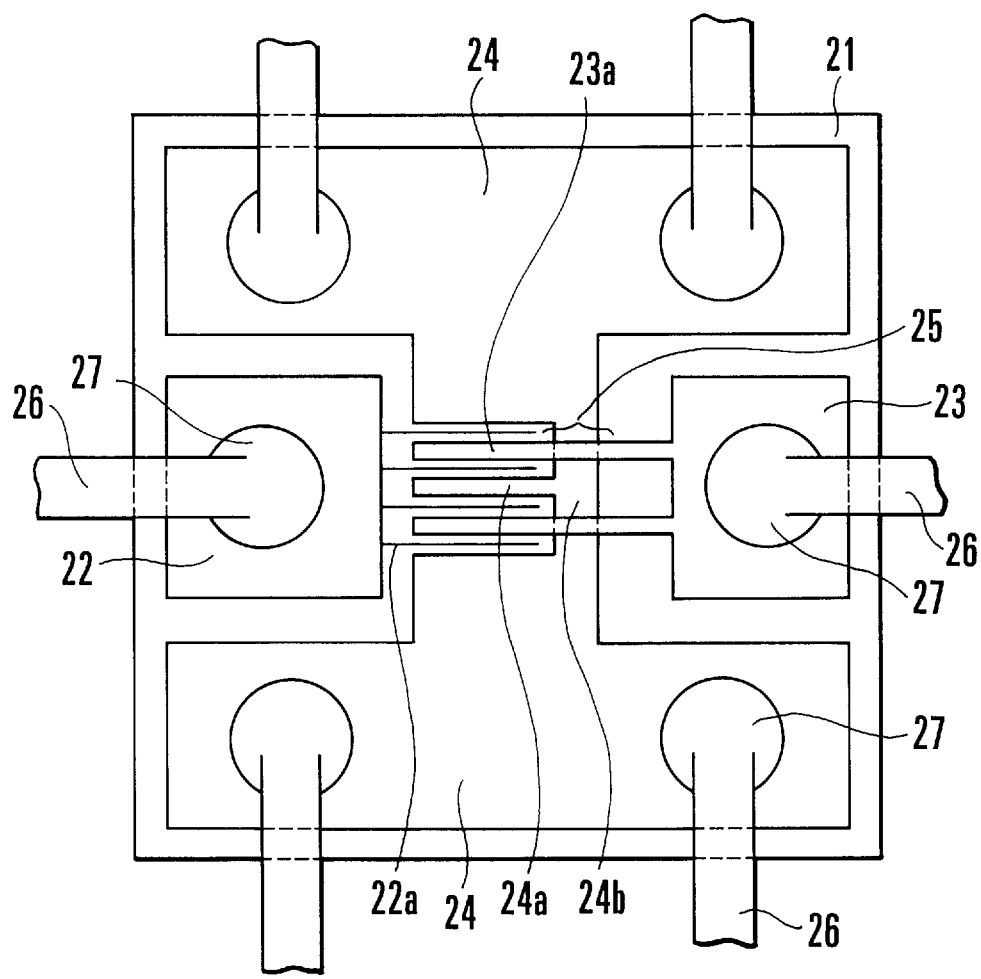
FIG. 5 is a view showing the H type element pattern of another conventional semiconductor device.

FIG. 2 shows the element pattern of a low-noise microwave transistor according to the second embodiment of the present invention. Referring to FIG. 2, a gate electrode pad 102, a drain electrode pad 103, and source electrode pads 104 form a pattern arrangement similar to that of FIG. 1, and a detail description thereof will thus be omitted.

Six comb-like gate fingers 102a are led out from the gate electrode pad 102 to the central portion of a pellet 101. Three drain fingers 103a led out from the drain electrode pad 103 are arranged on three regions sandwiched by the two central gate fingers 102a and the two side gate fingers 102a. The two source electrode pads 104 are connected to each other through a source electrode path 104b arranged between the drain electrode pad 103 and the distal ends of the gate fingers 102a led out from the gate electrode pad 102. The drain fingers 103a extend above the source electrode path 104b to lie across it through aerial wirings 105.

The two source fingers 104a led out from the source electrode path 104b are arranged on the two remaining regions sandwiched by the gate fingers 102a. Two bonding wires 106 are bonded to each of the gate electrode pad 102 and the drain electrode pad 103 through bonding balls 107. Another two bonding wires 106 are bonded to each of the two source electrode pads 104 through bonding balls 107, resulting in a total of four bonding wires 106.

In this embodiment, the drain fingers 103a are formed by the aerial wirings. However, the source electrode path 104b may be formed by the aerial wirings. In place of the aerial wirings 105, cross wirings may be used in which upper wirings are formed over lower wirings through an insulating film.

(Third Embodiment)

FIG. 3 shows the element pattern of a low-noise microwave transistor according to the third embodiment of the present invention. The same reference numerals are used to denote the same or equivalent portions as in FIG. 1, and a detailed description thereof will be omitted. In this embodiment, as shown in FIG. 3, the gap of gate fingers 102a and the size of bonding wires 106 and bonding balls 107 are not changed but other portions are made small, so that the area of a pellet 101 is decreased to about half. When compared to FIGS. 1 and 2, the positions of two source electrode pads 104 are replaced with the positions of the gate electrode pad 102 and a drain electrode pad 103 in FIG. 3.

In this manner, it suffices if the gate electrode pad 102 and the drain electrode pad 103 are respectively arranged on the two corners located on one diagonal line and the two source electrode pads 104 are respectively arranged on the two corners located on the other diagonal line. With this arrangement, the gate electrode pad 102 and drain electrode pad 103 can have larger areas than in the conventional case with respect to the areas of the source electrode pads 104 having the same size. In other words, to form the gate electrode pad 102 and drain electrode pad 103 having the same area, the pellet 101 which is smaller than the conventional pellet 101 suffices, and downsizing of the pellet 101 can be realized.

As has been described above, according to the present invention, the areas of the gate electrode pad and drain electrode pad can be made larger than in the conventional case by arranging the gate, source, and drain electrode pads on the four corners of the pellet. The allowable range of misalignment in bonding is increased accordingly, so that the defective bonding rate is decreased, and the productivity is improved. Also, the size of the pellet can be made smaller than the conventional pellet.

What is claimed is:

1. A semiconductor device comprising
    a square pellet having first and second diagonal lines,
    a gate electrode pad arranged on one of two corners located on the first diagonal line on said pellet,
    a drain electrode pad arranged on the other of the two corners located on the first diagonal line on said pellet,
    a pair of source electrode pads arranged on two corners located on the second diagonal line on said pellet, and
    a source electrode path for connecting said source electrode pads to each other.

2. A device according to claim 1, further comprising
    a plurality of comb-like gate fingers led out from said gate electrode pad and arranged at a central portion of said pellet,
    drain fingers led out from said drain electrode pad and arranged at every other regions within a plurality of regions sandwiched by said gate fingers, and
    a source finger led out from said source electrode path and arranged at a remaining region in said plurality of regions sandwiched by said gate fingers, and
    wherein said gate fingers, said drain fingers, and said source finger are electrically insulated from said source electrode path.

3. A device according to claim 2, wherein said source electrode path is arranged between said gate electrode pad and distal ends of said drain fingers led out from said drain electrode pad to lie across said gate fingers.

4. A device according to claim 3, wherein at a crossing portion of said source electrode path and said gate fingers, one of said source electrode path and said gate fingers is aerially wired.

5. A device according to claim 3, wherein at a crossing portion of said source electrode path and said drain fingers, said source electrode path and said gate fingers are cross-wired through an insulating film.

6. A device according to claim 2, wherein said source electrode path is arranged between said drain electrode pad and distal ends of said gate fingers led out from said gate electrode pad to lie across said drain fingers.

7. A device according to claim 6, wherein at a crossing portion of said source electrode path and said drain fingers, one of said source electrode path and said gate fingers is aerially wired.

8. A device according to claim 6, wherein at a crossing portion of said source electrode path and said drain fingers, said source electrode path and said gate fingers are cross-wired through an insulating film.

9. A device according to claim 1, further comprising a plurality of bonding wires led out from said gate, drain, and source electrodes through bonding balls having a predetermined shape.

* * * * *